(12) United States Patent
Lozzi

(10) Patent No.: US 10,938,336 B2
(45) Date of Patent: Mar. 2, 2021

(54) WIND GENERATOR

(71) Applicant: Orlando Lozzi, Isernia (IT)

(72) Inventor: Orlando Lozzi, Isernia (IT)

(\*) Notice: Subject to any disclaimer, the term of this patent is extended or adjusted under 35 U.S.C. 154(b) by 0 days.

(21) Appl. No.: 16/676,651

(22) Filed: Nov. 7, 2019

(65) Prior Publication Data

US 2020/0153378 A1 May 14, 2020

(30) Foreign Application Priority Data

Nov. 8, 2018 (IT) .................. IT102018000010157

(51) Int. Cl.
| | |
|---|---|
| *H02S 10/12* | (2014.01) |
| *H02S 40/22* | (2014.01) |
| *H02S 40/32* | (2014.01) |
| *H02S 40/42* | (2014.01) |
| *F03D 9/25* | (2016.01) |
| *F03D 3/06* | (2006.01) |
| *F03D 9/00* | (2016.01) |
| *G02B 3/08* | (2006.01) |
| *G02B 19/00* | (2006.01) |
| *H01L 31/0304* | (2006.01) |

(Continued)

(52) U.S. Cl.
CPC .............. *H02S 10/12* (2014.12); *F03D 3/062* (2013.01); *F03D 9/007* (2013.01); *F03D 9/255* (2017.02); *G02B 3/08* (2013.01); *G02B 19/0009* (2013.01); *G02B 19/0042* (2013.01); *H01L 31/03048* (2013.01); *H01L 31/03926* (2013.01); *H01L 31/052* (2013.01); *H01L 31/0725* (2013.01); *H01L 31/0735* (2013.01); *H02K 7/183* (2013.01); *H02K 13/003* (2013.01); *H02S 40/22* (2014.12); *H02S 40/32* (2014.12); *H02S 40/42* (2014.12); *H01R 39/18* (2013.01)

(58) Field of Classification Search
CPC .......... H02S 10/12; H02S 40/22; H02S 40/32; H02S 40/42
See application file for complete search history.

(56) References Cited

U.S. PATENT DOCUMENTS 8,338,977 B2 * 12/2012 Lee ........................... F03D 9/00
290/44
8,674,571 B2 * 3/2014 Lee ........................ H01L 31/02
310/75 C (Continued)

FOREIGN PATENT DOCUMENTS

| FR | 2945841 A1 | 11/2010 |
|---|---|---|
| FR | 2966988 A1 | 5/2012 |
| WO | 2014/181585 A1 | 11/2014 |

OTHER PUBLICATIONS

Search Report and Written Opinion issued in connection with counterpart co-pending Italian Patent Application No. 102018000010157 dated Sep. 24, 2019.

*Primary Examiner* — Sean Gugger
(74) *Attorney, Agent, or Firm* — Howson & Howson LLP

(57) ABSTRACT

Integrated wind-photovoltaic system for the production of electrical energy, the system comprising a wind generator equipped with a semi-vertical axis provided, in turn, with wind blades having a back, wherein the back of the aerodynamic profile of these wind blades is at least partially provided with a covering consisting of flexible photovoltaic panels, and wherein a sunlight concentration optical system is provided comprising a plurality of coplanar lenses.

14 Claims, 4 Drawing Sheets

(51) Int. Cl.
*H01L 31/0392* (2006.01)
*H01L 31/052* (2014.01)
*H01L 31/0725* (2012.01)
*H01L 31/0735* (2012.01)
*H02K 7/18* (2006.01)
*H02K 13/00* (2006.01)
*H01R 39/18* (2006.01)

(56) References Cited

U.S. PATENT DOCUMENTS

| | | | |
|---|---|---|---|
| 10,598,152 B2 * | 3/2020 | Peter | H02S 40/34 |
| 2008/0047270 A1 * | 2/2008 | Gilbert | F03D 13/20 |
| | | | 60/641.12 |
| 2011/0193512 A1 * | 8/2011 | Singhal | H02S 10/12 |
| | | | 320/101 |
| 2011/0232630 A1 * | 9/2011 | Tsao | F03D 9/007 |
| | | | 126/600 |
| 2012/0119692 A1 * | 5/2012 | Ryu | F03D 80/00 |
| | | | 320/101 |
| 2016/0025067 A1 * | 1/2016 | Pristash | F03D 3/0427 |
| | | | 290/55 |
| 2016/0040656 A1 * | 2/2016 | Dakhil | F03D 9/25 |
| | | | 307/72 |
| 2016/0230740 A1 * | 8/2016 | Lozzi | F03D 9/25 |
| 2018/0223810 A1 * | 8/2018 | Bootsma, Jr. | F24S 20/20 |

* cited by examiner

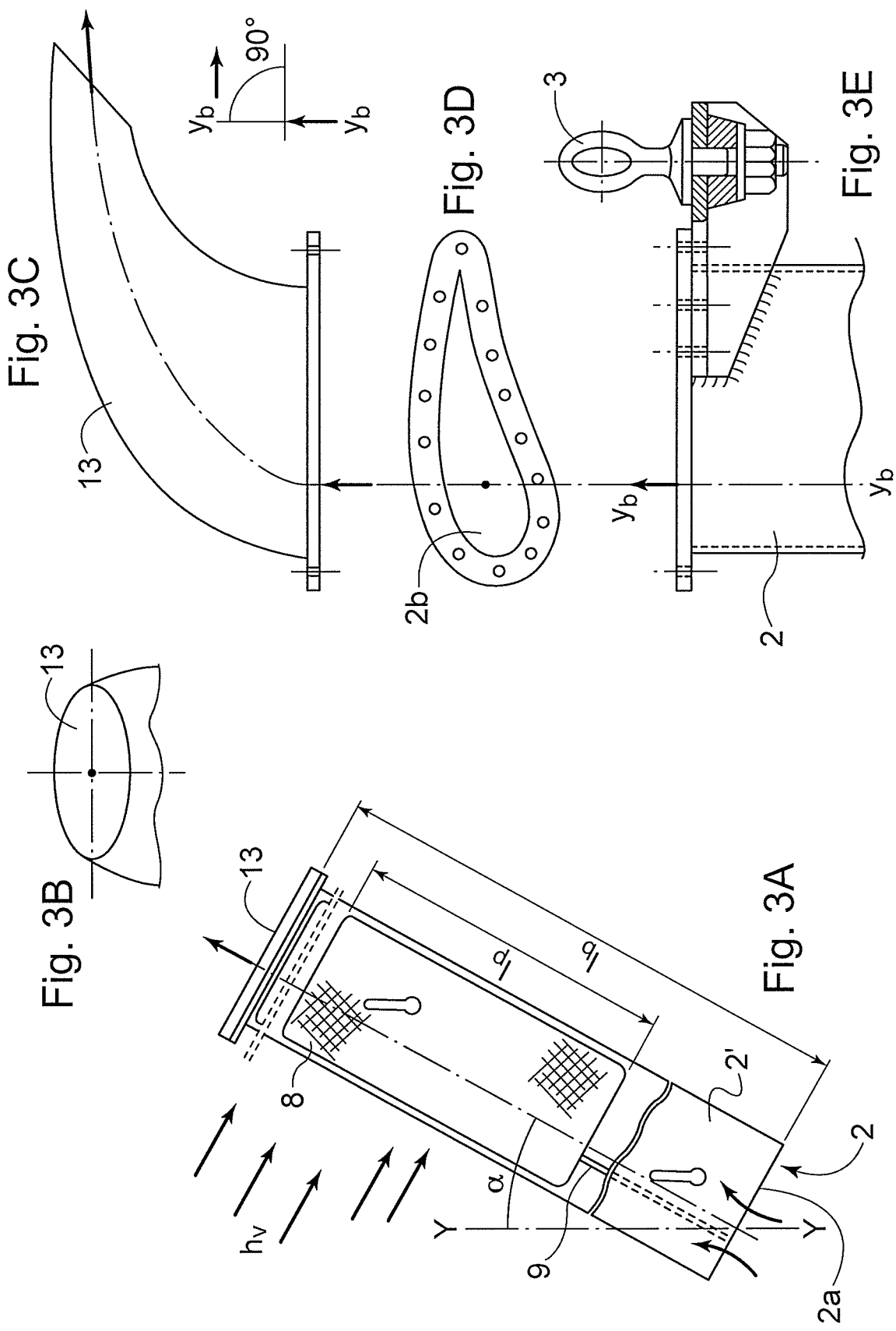

WIND GENERATOR

TECHNICAL FIELD

The invention relates to an integrated wind-photovoltaic system for the production of electrical energy. More particularly, the invention relates to a system for the production of electrical energy that integrates both a wind-operated machine, which exploits wind energy, and photovoltaic panels, which exploit the energy derived from solar radiation.

BACKGROUND

So-called wind generators having a semi-vertical axis, i.e. equipped with a rotor having a substantially vertical rotation axis and a plurality of wind blades associated with the base of the rotor and oriented in a "V"-like configuration so as to form a diverging angle starting from the base towards the top of the rotor, are known in the field of the production of electric energy. Recent advances in this technical field have allowed to build more and more efficient machines for converting wind energy into electrical energy. Still with reference to the field of electrical energy production, photovoltaic panel generators are also known. In this field, recent technical developments have allowed to manufacture photovoltaic panels with reduced thickness and electrical conversion efficiency 250% higher than that of conventional, first-generation panels made of amorphous silicon.

To date, known generators, both wind generators and photovoltaic ones, still require, however, large investments for the installation thereof. Moreover, in order to justify the economic investment required for the making of wind generators or photovoltaic panels, it is still necessary to provide large wind generators, or large areas available for covering with photovoltaic panels.

In the field of electrical energy production, for example, integrated wind-photovoltaic systems are known, including a wind generator that is equipped with a vertical axis rotor and blades associated with that rotor and is provided with photovoltaic panels. These systems are described, for example, in the documents US 2008/047270 A1 and JP WO2014181585 A1.

However, known integrated wind-photovoltaic systems have a number of drawbacks, including the complexity of mounting such systems, as well as high production costs.

Nowadays, in the field of electrical energy production from so-called renewable sources, the need to create increasingly efficient and compact systems that can be adopted profitably, even with a reduced economic investment, is therefore strongly felt.

A main object of the invention is therefore to provide a system of electrical energy generation that is compact and capable of producing significant amounts of electrical energy.

A further object of the invention is to provide a system for electrical energy generation that can find application in many sectors of use.

A type of latest-generation photovoltaic panels is represented by photovoltaic panels of the flexible type, i.e. capable of adapting to surfaces even if not perfectly flat. Moreover, nowadays, flexible photovoltaic panels of reduced thickness are available, typically of the order of millimeters, for example with a thickness of about 1.5-2.0 mm. These latest-generation, flexible, thin photovoltaic panels are known to have high electrical conversion efficiency, but have the disadvantage of being subject to considerable heating when exposed to solar radiation. The phenomenon of heating occurs in particular when, in order to increase the specific power, the solar radiation is concentrated on the panels by using lenticular systems.

However, since photovoltaic panels manufactured with the use of the latest technologies are able to show an efficiency at least twice as much as that of conventional panels, it is therefore clear that the use of such panels and the solution to the above problem of heating are highly desirable and beneficial.

The invention therefore also aims to overcome these undesirable effects of new technologies used for the making of photovoltaic panels, by developing an appropriate technological solution.

SUMMARY

The integrated wind-photovoltaic system for the production of electrical energy according to the invention comprises a wind generator equipped with a rotor having a semi-vertical axis and provided, in turn, with wind blades, wherein the back of the aerodynamic profile of such wind blades is provided, at least on part of the surface of the back, with a covering consisting of flexible photovoltaic panels. Preferably, the wind blades are tilted with respect to the vertical axis of the rotor. In addition, the blades include a body in which a first lower end, proximal and constrained to the rotor hub, and a second upper end or top, distal to the rotor hub, are defined.

Advantageously, therefore, the system according to the invention integrates in a single compact machine the double function of a semi-vertical wind generator and a solar radiation collector.

According to a preferred embodiment of the invention, the covering consisting of flexible photovoltaic panels covers a large longitudinal area of the back of the wind blades. Even more preferably, the covering consisting of flexible photovoltaic panels covers most of, or even better the whole of, the available surface area defined on the back of the wind blades. In addition, the photovoltaic panels are preferably joined along the aerodynamic profile of the blade itself.

In the integrated system according to the invention, the wind blades are arranged in a semi-vertical, "V"-like configuration, so as to form a substantially truncated cone with the minor base arranged below relative to the substantially vertical rotation axis of the rotor.

Advantageously, according to the invention, the solar radiation is concentrated by using a special optical structure, or optical system, with sunlight concentration, consisting of a plurality of focusing lenses, preferably coplanar, connected at the top apical region of the blades of the wind generator.

Advantageously, the optical system for concentrating and focusing sunlight on the photovoltaic panels is composed of several planes of concentration Fresnel lenses arranged in vertical succession along the vertical rotation axis of the rotor. Preferably, the concentration Fresnel lenses of the optical system are mutually spaced and interconnected and are associated with a tie rod mesh attached to the upper ends of the wind blades.

The structural configuration with concentration Fresnel lenses in vertical succession, exploiting the multiple refraction of the lenses, is able to ensure the focusing and irradiation of the photovoltaic panels over wide angles of sun position throughout the day and while the generator is rotating due to the effect of the wind thrust.

In a preferred embodiment of the invention, the optical system with solar radiation concentration is provided arranged in at least one plane perpendicular to the rotation axis. Even more preferably, the invention provides that this optical system is arranged in two separate parallel planes, spaced from each other so that the ratio between the distance between these planes and the maximum diameter of the rotor, i.e. the diameter measured at the circumference passing through the upper ends or tops of the wind blades, is between 1/10 and 1/2, preferably 1/5.

According to a more preferred embodiment of the invention, the optical system includes a concentric polygonal matrix, preferably consisting of high-strength belts tensioned between a central ring, arranged coaxial with the substantially vertical rotation axis of the rotor of the wind generator, and corresponding coupling brackets provided at the upper ends or tops of the wind blades. This matrix defines a substantially flat upper structure, for the attachment of a plurality of concentration Fresnel lenses defining a corresponding first or upper plane of the optical system. According to the invention, preferably, the concentration Fresnel lenses have an average value factor of sunlight concentration. This factor of sunlight concentration is preferably between 40 and 60×.

Still according to the invention, the concentration Fresnel lenses include prismatic modules with large angles β of incident radiation acceptance, β being preferably up to 25°.

The concentration Fresnel lenses preferably have an upper layer made of a polymethyl methacrylate polymer, which defines an upper face of the lens, this upper face being the face exposed to solar radiation, and a lower layer made of polycarbonate and having a multi-prismatic configuration, which defines an opposite lower face. These lenses also have a high radiation transmittance coefficient, preferably greater than 90%.

According to a preferred embodiment of the invention, the covering consisting of flexible photovoltaic panels covers a large longitudinal area of the back of the wind blades. In addition, the photovoltaic panels are joined along the aerodynamic profile of the blade itself.

A type of photovoltaic panel particularly suitable for the purpose of the invention includes flexible multi junction photovoltaic panels, with gallium nitride (GaN)-indium gallium nitride (InGaN) for high temperatures. These panels typically have high electrical conversion efficiency, higher than 45%, for the spectrum between 400 and 1000 nm wavelength.

According to a preferred embodiment of the invention, the wind blades with flexible photovoltaic panels are made of an aluminum alloy, so as to promote dissipation of the heat that is generated in correspondence of these panels and increase the yield of electrical conversion, even in case of prolonged use. The flexibility of latest-generation photovoltaic panels advantageously allows perfect adhesion and integration to the preferably curved back of the wind blades, without affecting the aerodynamic performance of the profile of the blades themselves.

To overcome the drawback of the drop in energy conversion efficiency due to heating of the photovoltaic panel, according to the invention the panel has been integrated into the back of the wind rotor blade. The blade is also advantageously made of an aluminum alloy with a hollow section, so that the blade itself performs a heat sink function. The wind blades also preferably include an elongated hollow body open at both ends and equipped, at its upper end or top, with a nozzle that discharges the airflow passing through the blades.

The hollow profile of the aluminum blade advantageously allows the passage of an airflow from the central internal area of fitting of the blade to the hub of the wind generator rotor, towards the external peripheral perimeter area, so as to ensure adequate dissipation of the heat of the panel integrated on the back of the blade, thus keeping the operating temperature close to the values that guarantee maximum energy conversion efficiency.

According to the invention, the flow of hot air exiting the upper periphery of the wind blade is suitably directed by means of a nozzle located at the upper distal end of the blade, in order to effectively exploit the thrust generated by the increase in speed of said flow, compared to the inlet, caused by the heating of the air due to the removal of heat from the photovoltaic panel while the airflow passes through the blade from the center of the rotor to the periphery. This nozzle in particular has a substantially "L"-like shape that can make the airflow passing therethrough perform a path substantially at 90°.

The system of electrical energy generation according to the invention provides that the electrical energy generated by the photovoltaic panels is preferably conveyed to an inverter by means of a brushes-collector system, arranged between the rotor of the wind generator and the support for the hub. The inverter can also be electrically connected to a system control panel.

In a preferred embodiment, the brushes-collector system includes a rotating collector ring, associated with the wind rotor, to which the electrical cables coming from the photovoltaic panels and fixed brushes integral with a fixed structure or pedestal rotatably supporting said wind rotor, for example through interposition of special bushings or bearings, are connected.

Still according to the invention, the electrical energy generated by the wind generator is preferably conveyed into the inverter into which the electrical energy generated by the photovoltaic panels is conveyed.

BRIEF DESCRIPTION OF THE DRAWINGS

Some preferred embodiments of the invention will be provided by way of non-limiting example with reference to the annexed drawings, in which:

FIG. 3A is a front view of a blade of the rotor of the wind generator in FIG. 1;

FIG. 3B is a perspective view from above of the nozzle of the wind blades in FIG. 3A;

FIG. 3C is a side view of the nozzle in FIG. 3B;

FIG. 3D is a cross-sectional view of the wind blade in FIG. 3A;

FIG. 3E is a partially sectional view of a coupling bracket provided at the top of the wind blade in FIG. 3A;

DETAILED DESCRIPTION

Figure 1:
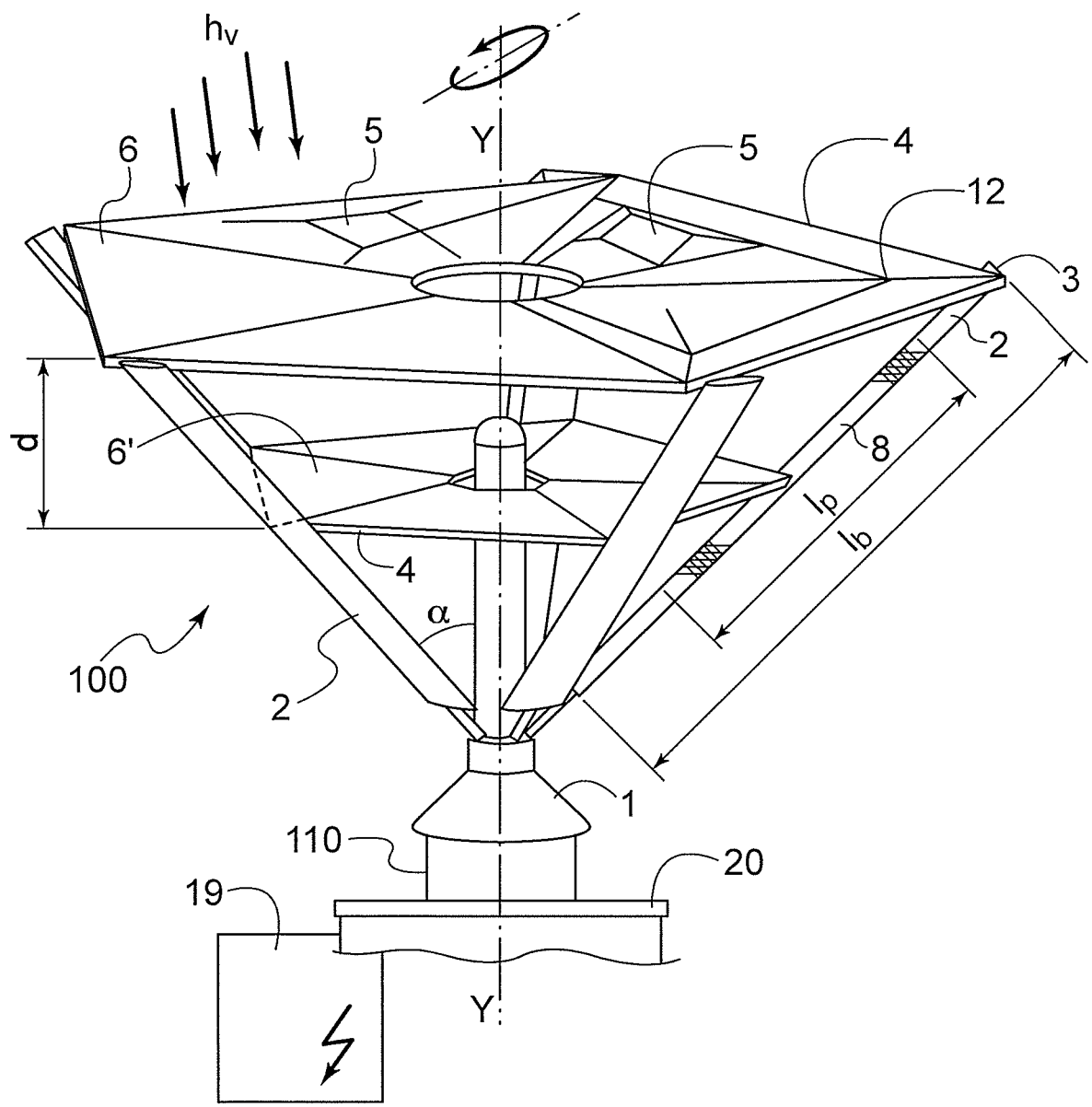
FIG. 1 is a partial side view of the system according to a preferred embodiment of the invention.

Referring to FIG. 1, the arrangement of the integrated wind-photovoltaic system for the production of electrical energy according to the invention is illustrated. The wind-photovoltaic system for the production of electrical energy comprises a wind generator 100 including a rotor 110 having a semi-vertical axis Y-Y and provided, in turn, with wind blades 2. The wind blades 2 include a body having a first lower end, proximal to the rotor hub 1 of the rotor 110 and constrained thereto, and a second upper end or top, distal to the hub 1 of the rotor 110. These wind blades 2 can preferably be from 2 and 7 in number and are preferably inclined at an angle α between 30° and 60° relative to the vertical axis Y-Y of the rotor 110 of the wind generator 100. In the illustrated embodiment, the wind blades 2 are arranged in a substantially "V"-like configuration so as to form a substantially frustoconical structure with the minor base arranged below, relative to the vertical rotation axis Y-Y of the rotor 110. The blades 2, below, are constrained to the hub 1 of the rotor 110 and, above, include a coupling bracket 3.

Advantageously, the wind-photovoltaic system according to the invention integrates in a single machine the double function of a semi-vertical wind generator and a solar radiation collector. To this aim, the system according to the invention includes a coating consisting of photovoltaic panels 8 and covering at least part of the surface of the back 2' of the aerodynamic profile of the blades 2. The photovoltaic panels 8 are also joined along the aerodynamic profile of the blade itself. The photovoltaic panels 8 include flexible photovoltaic panels. The flexibility of these photovoltaic panels 8 advantageously allows perfect adhesion to the back 2', usually curvilinear, of the blades 2.

A type of photovoltaic panel particularly suitable for the purpose of the invention includes flexible multi junction photovoltaic panels, with gallium nitride (GaN)-indium gallium nitride (InGaN) for high temperatures. These panels typically have high electrical conversion efficiency, higher than 45%, for the spectrum between 400 and 1000 nm wavelength.

Advantageously, according to the invention, the solar radiation $h_v$ is concentrated by using a special optical system or optical structure with sunlight concentration. The optical system comprises a plurality of coplanar lenses 5 connected at the top apical region of the blades 2 of the wind generator 100.

Advantageously, the optical system for concentrating and focusing the light $h_v$ on the photovoltaic panels 2 consists of several planes 6, 6' of concentration Fresnel lenses 5 arranged in vertical succession along the rotation axis Y-Y of the rotor 110. In addition, the optical system includes a concentric polygonal matrix 112, preferably consisting of high-strength belts 4 tensioned between a central ring, arranged coaxial with the vertical rotation axis Y-Y of the rotor 110, and the coupling brackets provided at the upper ends the blades 2. The belts 4 are preferably made of a material based on special Kevlar29+Nylon fibers. The polygonal matrix 112 consisting of belts 4 defines a substantially flat flexible mesh structure 12 on which the concentration Fresnel lenses 5 are attached by means of suitable supports. In the illustrated embodiment, the polygonal matrix consisting of belts 4 defines two separate substantially parallel planes 6, 6', suitably spaced from each other and substantially perpendicular to the vertical rotation axis Y-Y of the rotor 110. According to the invention, the distance between the two planes 6, 6' is chosen so that the ratio between the distance between these planes 6, 6' and the maximum diameter of the rotor 110, i.e. the diameter measured at the circumference passing through the upper ends or tops of the wind blades 2, is between 1/10 and 1/2, preferably 1/5. A first terminal plane 6 is located in correspondence with the upper zone of the wind blades 2, whereas the second plane 6' is located below said first plane 6 at a distance "d" suitably chosen according to the diameter of the rotor 110, preferably between 0.2 and 1.0 meters in the example shown. In other embodiments, it will be possible to provide more than two planes of concentration Fresnel lenses, or just one.

Figure 2A:
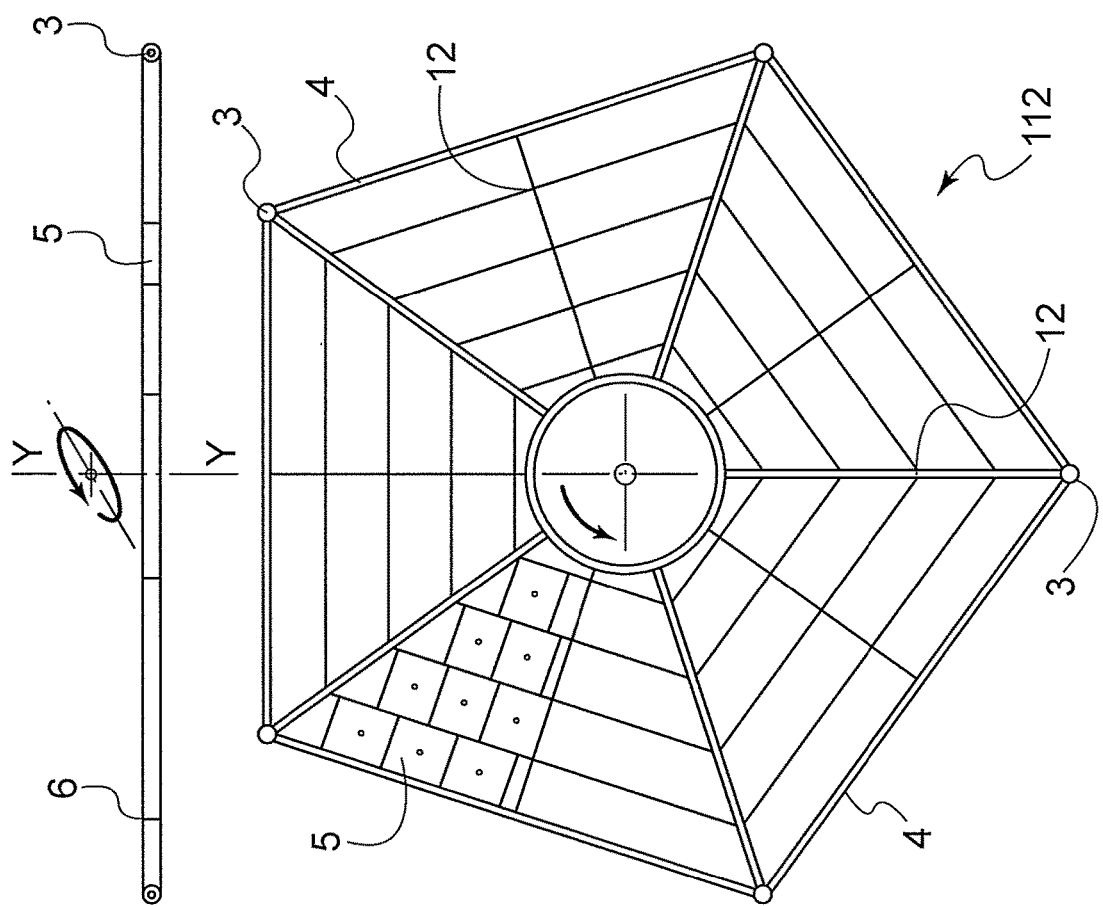
FIG. 2A is a top plan view of the polygonal matrix supporting the lenses of the optical system.
Figure 2C:
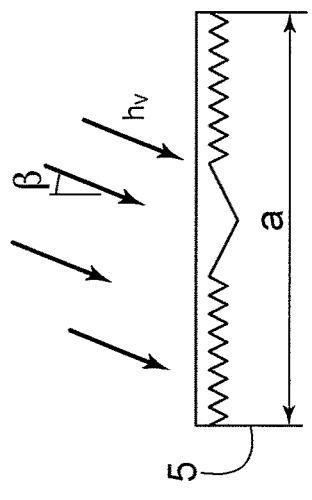
FIG. 2C is a sectional view taken along a transverse plane of the lens in FIG. 2B.
Figure 2B:
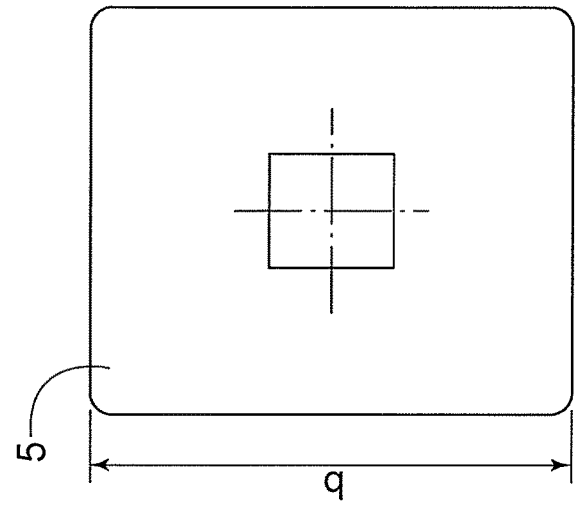
FIG. 2B is a top plan view of a lens in FIG. 2A.

Referring now to FIGS. 2A, 2B and 2C, the system of belts 4 and lens support 112 forming a terminal coplanar structure 6 is shown. In FIGS. 2B and 2C there is illustrated a Fresnel lens 5 used in the making of the optical system, this lens having a substantially rectangular shape and preferably having a width "a" smaller than a length "b". Preferably, these concentration Fresnel lenses 5 have an average value factor of concentration of sunlight $h_v$, more preferably between 40 and 60×. Still according to the invention, the concentration Fresnel lenses 5 include prismatic modules with large angles β of acceptance of the incident radiation $h_v$, τ3 being preferably up to 25°.

Flexible photovoltaic panels 8 with high electrical energy generation efficiency are attached to each blade 2, in the back region of the blade oriented towards the coplanar structures 6 e 6'.

Referring to FIGS. 3A to 3E, these illustrate in detail a blade 2, to the back 2' of which the photovoltaic panels 8 are coupled. The blade 2 comprises and elongated body open at both ends and defining an inner cavity 2b. The blade 2 is advantageously made of an aluminum alloy with high thermal conductivity, whereby the blades 2 have a heat sink function for the heat that develops in correspondence of the photovoltaic panels 8 during the solar radiation $h_v$. In the shown example, the photovoltaic panels 8 cover a longitudinal portion of the back 2' of the blade 2 extending over a length $l_p$ of the overall length $l_b$ of the wind blade 2. In other embodiments, however, it will be possible to provide that the photovoltaic panels cover most of the back surface of the wind blade or, even better, the entire surface of the wind blade.

The inner cavity 2b of the blade 2 allows the passage of air inside the blade, so that the air, passing though the body of the blade 2, can cool down the photovoltaic panel 8 integrated on the back 2' of the blade 2.

The flow of heated air passing through the inside of the hollow section 9 of each blade 2 is sucked at room temperature through the lower opening 2a of the blade 2, near the hub 1 of the wind generator, and is discharged at the apex of the blade 2 in correspondence of a suitable nozzle 13 located in a position substantially orthogonal to the axis $y_b$ of the blade 2, after passing through the inner cavity 2b of the blade 2.

Figure 4:
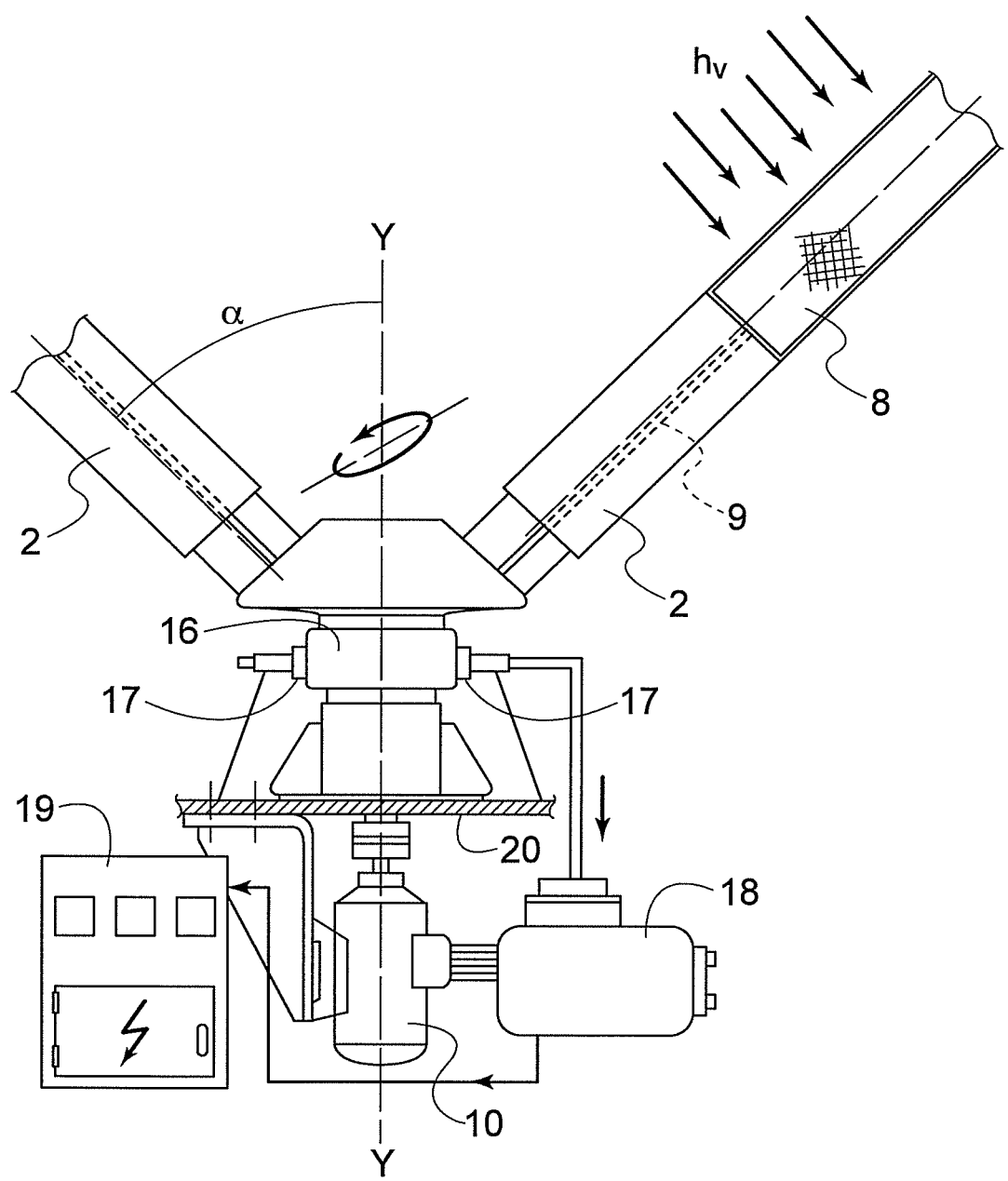
FIG. 4 is an overall side view of the system according to the invention.

Referring to FIG. 4, the circuit diagram of conveyance of the electrical energy produced by the integrated wind-photovoltaic system according to the invention into the electrical panel 19 is illustrated.

The electrical energy generated by the photovoltaic panels 8 is conveyed, through electrical cables coming out of the panels 8 and towards the lower end of each blade 2 and connected to a device including a bipolar rotating collector 16 provided with rings integral with the hub 1, and brushes 17 fixed to a support structure 20.

The central rotating hub 1 is connected to a rotor of an electrical generator 10 connected to an inverter 18 to which the electrical energy from the photovoltaic panels 8 is also conveyed through the brushes 17.

The invention as described and illustrated is susceptible to several variations and modifications, all of which fall within the same inventive principle.

The invention claimed is:

1. An integrated wind-photovoltaic system for the production of electrical energy, the system comprising:
    a wind generator having a rotor with a semi-vertical axis and wind blades each having a back with an aerodynamic profile which is at least partially provided with a covering of flexible photovoltaic panels; and
    a sunlight concentration optical system comprising a plurality of coplanar lenses;
    wherein said rotor has a rotor hub and each of said wind blades includes a body having a lower end that is proximal and constrained to said rotor hub and an upper end that is distal to said rotor hub, and each of said wind blades is tilted with respect to the semi-vertical axis of said rotor, and
    wherein said plurality of coplanar lenses includes focusing lenses connected at top apical regions of said upper ends of said wind blades of said wind generator.

2. The system according to claim 1, wherein the optical system is arranged on two separate parallel planes spaced a distance from each other, and wherein a ratio between the distance between the two separate parallel planes and a maximum diameter of the rotor is between $1/10$ and $1/2$.

3. The system according to claim 2, wherein the optical system includes a concentric polygonal matrix of high-strength belts tensioned between a central ring and coupling brackets provided at the upper ends of the wind blades.

4. The system according to claim 3, wherein the optical system includes a plurality of concentration Fresnel lenses, with an average value factor of sunlight concentration between 40 and 60×.

5. The system according to claim 4, wherein the concentration Fresnel lenses include prismatic modules with large angles β of incident radiation acceptance, β being preferably up to 25°.

6. The system according to claim 4, wherein each of the concentration Fresnel lenses has an upper layer made of a polymethyl methacrylate polymer defining an upper face exposed to solar radiation, wherein each of the concentration Fresnel lenses has a lower layer made of polycarbonate providing a multi-prismatic configuration, the lower layer defining an opposite lower face, and wherein each of the concentration Fresnel lenses has a high radiation transmittance coefficient greater than 90%.

7. The system according to claim 3, wherein the covering of flexible photovoltaic panels covers a longitudinal area of the back of each of the wind blades, and wherein the panels are joined along the aerodynamic profile of the back.

8. The system according to claim 3, wherein the flexible photovoltaic panels include flexible multi junction photovoltaic panels, with gallium nitride (GaN)-indium gallium nitride (InGaN) for high temperatures, with high electrical conversion efficiency, higher than 45%, for a spectrum between 400 and 1000 nm wavelength.

9. The system according to claim 3, wherein the wind blades are made of an aluminum alloy so as to promote heat dissipation of heat generated in correspondence of the flexible photovoltaic panels to increase yield of electrical conversion.

10. The system according to claim 3, wherein the body of each of the wind blades is elongated, hollow, and open at the upper and lower ends has a nozzle at the upper end that discharges airflow passing through the body.

11. The system according to claim 3, wherein electrical energy generated by the photovoltaic panels is conveyed to a management inverter through a brushes-collector system arranged between the rotor and a support for the rotor hub, the brushes-collector system including a rotating collector ring, associated with the rotor.

12. The system according to claim 11, wherein the electrical energy generated by the wind generator is conveyed into the inverter into which the electrical energy generated by the photovoltaic panels is conveyed, the inverter being electrically connected to a system control panel.

13. The system according to claim 1, wherein each of the wind blades is inclined at an angle of 30° and 60° relative to the semi-vertical axis of the rotor of the wind generator.

14. An integrated wind-photovoltaic system for production of electrical energy, the system comprising:
    a wind generator having a rotor with a semi-vertical axis and wind blades each having a back with an aerodynamic profile which is at least partially provided with a covering of flexible photovoltaic panels; and
    a sunlight concentration optical system comprising a first plurality of coplanar lenses and a second plurality of coplanar lenses arranged on two separate parallel planes spaced a distance from each other such that a ratio between the distance between the two separate parallel planes and a maximum diameter of the rotor is between $1/10$ to $1/2$;
    wherein the optical system includes a concentric polygonal matrix of high-strength belts tensioned between a central ring and coupling brackets provided at upper ends of the wind blades.

* * * * *